(12) United States Patent
Al-Hazmi et al.

(10) Patent No.: US 9,962,914 B2
(45) Date of Patent: May 8, 2018

(54) METHOD FOR TRANSFERRING A LARGE-AREA GRAPHENE SHEET

(71) Applicant: King Abdulaziz University, Jeddah (SA)

(72) Inventors: Farag Saeed Marshoud Al-Hazmi, Jeddah (SA); Ahmed Abdullah Salem Al-Ghamdi, Jeddah (SA); Waleed Elsayed Mahmoud Elsayed, Ismailia (EG)

(73) Assignee: King Abdulaziz University, Jeddah (SA)

( * ) Notice: Subject to any disclaimer, the term of this patent is extended or adjusted under 35 U.S.C. 154(b) by 128 days.

(21) Appl. No.: 15/002,440

(22) Filed: Jan. 21, 2016

(65) Prior Publication Data

US 2017/0210107 A1     Jul. 27, 2017

(51) Int. Cl.
*B32B 37/00*     (2006.01)
*B32B 15/04*     (2006.01)
(Continued)

(52) U.S. Cl.
CPC ............ *B32B 37/025* (2013.01); *B32B 15/04* (2013.01); *B32B 18/00* (2013.01);
(Continued)

(58) Field of Classification Search
CPC ......... H01L 2924/0002; H01L 2924/00; H01L 21/2855; H01L 21/76843; H01L 21/76871;
(Continued)

(56) References Cited

U.S. PATENT DOCUMENTS

| 4,917,758 A | 4/1990 | Ishizuka et al. |
| 6,391,163 B1 | 5/2002 | Pavate et al. |

(Continued)

FOREIGN PATENT DOCUMENTS

| CN | 102583352 A | 7/2012 |
| CN | 104183698 A | 12/2014 |

OTHER PUBLICATIONS

"Alloy." Merriam-Webster.com. Merriam-Webster, n.d. Web. Dec. 28, 2017.*

(Continued)

*Primary Examiner* — Sonya Mazumdar
(74) *Attorney, Agent, or Firm* — Oblon, McClelland, Maier & Neustadt, L.L.P.

(57) ABSTRACT

A method of transferring a graphene sheet comprising one or more layers of graphene formed on a metal film, such as a copper film, coating a surface of a metal or alloy substrate onto a target substrate. The method includes fixedly contacting the graphene sheet with a contacting surface of the target substrate by applying substantially uniform pressure and heat on a layered assembly. The layered assembly comprises the metal or alloy substrate, the graphene sheet, and the target substrate. At least one layer of graphene of the graphene sheet formed on the copper film coating the surface of the metal or alloy substrate is transferred onto the contacting surface of the target substrate by the substantially uniform pressure and heat, and the at least one layer of graphene forms a graphene film on the contacting surface of the target substrate.

20 Claims, 8 Drawing Sheets

(51) Int. Cl.
*B32B 18/00* (2006.01)
*H01J 37/34* (2006.01)
*B82Y 30/00* (2011.01)
*B82Y 40/00* (2011.01)

(52) U.S. Cl.
CPC ....... H01J 37/3426 (2013.01); *B32B 2311/12* (2013.01); *B32B 2313/04* (2013.01); *B82Y 30/00* (2013.01); *B82Y 40/00* (2013.01); *C04B 2237/363* (2013.01); *Y10T 156/17* (2015.01); *Y10T 156/1705* (2015.01); *Y10T 156/1956* (2015.01); *Y10T 428/30* (2015.01)

(58) Field of Classification Search
CPC ......... H01L 21/76873; H01L 23/53233; H01L 23/53238; H01L 29/66015; B82Y 30/00; B82Y 40/00; B32B 38/18; B32B 43/006; C01B 31/0438; C01B 31/0453; C01B 31/0484; C08J 7/00; C08J 7/02; C23C 14/35; C23F 1/18; H01J 37/3426; H05K 2203/0353; H05K 3/06; Y10T 156/17; Y10T 156/1705; Y10T 156/1956; Y10T 428/30
USPC .................................................. 156/230, 233
See application file for complete search history.

(56) References Cited

U.S. PATENT DOCUMENTS

| | | | | |
|---|---|---|---|---|
| 8,492,753 B2* | 7/2013 | Yager | .................. | C23C 16/0281 257/40 |
| 8,916,057 B2 | 12/2014 | Hong et al. | | |
| 9,828,285 B2* | 11/2017 | Johnson | .................. | C03C 15/00 |
| 2011/0104442 A1* | 5/2011 | Yoon | ...................... | B82Y 30/00 428/152 |
| 2012/0267041 A1* | 10/2012 | Woo | ........................ | B32B 37/02 156/230 |
| 2013/0065034 A1* | 3/2013 | Muramatsu | .......... | H01B 13/321 428/213 |
| 2013/0264009 A1* | 10/2013 | Kimura | .............. | H01B 13/0036 156/230 |
| 2014/0130972 A1* | 5/2014 | Ren | .......................... | C25B 1/00 156/249 |
| 2014/0231002 A1 | 8/2014 | Patil et al. | | |
| 2014/0313588 A1* | 10/2014 | Hong | ....................... | G02B 3/00 359/642 |
| 2016/0137507 A1* | 5/2016 | You | ..................... | C01B 31/0438 428/408 |

OTHER PUBLICATIONS

Toshiyuki Kobayashi, et al., "Production of a 100-m-long high-quality graphene transparent conductive film by roll-to-roll chemical vapor deposition and transfer process", Applied Physics Letters, http://scitation.aip.org/content/aip/journal/apl/102/2/10.1063/1.4776707, vol. 102, Issue 2, 2013, 2 pages (Abstract only).

Xuan Wang, et al., "Transparent, Conductive Graphene Electrodes for Dye-Sensitized Solar Cells", Nano Letters, vol. 8, No. 1, 2008, pp. 323-327 (Abstract only).

David S. Hecht, et al., "Emerging Transparent Electrodes Based on Thin Films of Carbon Nanotubes, Graphene, and Metallic Nanostructures", Advanced Materials, vol. 23, Issue 13, Apr. 5, 2011, pp. 1482-1513 (Abstract only).

Akshay Kumar, et al., "The Race to Replace Tin-Doped Indium Oxide: Which Material Will Win?" ACS Nano, www.acsnano.org, vol. 4, No. 1, 2010, pp. 11-14.

Sukanta De, et al., "Flexible, Transparent, Conducting Films of Randomly Stacked Graphene from Surfactant-Stabilized, Oxide-Free Graphene Dispersions", Small, vol. 6, No. 3, 2010, pp. 458-464.

Dilini Galpaya, et al., "Recent Advances in Fabrication and Characterization of Graphene-Polymer Nanocomposites", Graphene, vol. 1, 2012, pp. 30-49.

Sasha Stankovich, et al., "Graphene-based composite materials", Nature, vol. 442, Jul. 20, 2006, pp. 282-286 (Abstract only).

Supinda Watcharotone, et al., "Graphene-Silica Composite Thin Films as Transparent Conductors", Nano Letters, vol. 7, No. 7, 2007, pp. 1888-1892 (Abstract only).

Jinhong Du, et al., "The Fabrication, Properties, and Uses of Graphene/Polymer Composites", Macromolecular Chemistry and Physics, vol. 213, 2012, pp. 1060-1077.

Liang Xu, et al., "Vanishing stick-slip friction in few-layer graphenes: the thickness effect", IOP Science, Nanotechnology, vol. 22, 2011, 3 pages (Abstract only).

* cited by examiner

METHOD FOR TRANSFERRING A LARGE-AREA GRAPHENE SHEET

BACKGROUND OF THE INVENTION

Technical Field

The present disclosure relates to methods of transferring a graphene sheet comprising one or more layers of graphene. More specifically, the present disclosure relates to methods of transferring a graphene sheet comprising one or more layers of graphene formed on a metal film, such as a copper film, coating a surface of a metal or alloy substrate onto a target substrate.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly nor impliedly admitted as prior art against the present invention.

Conventional transparent conducting electrodes commonly used in solar cells, touch sensors and flat panel displays make use of indium tin oxide (ITO). ITO is an essential element in virtually all flat-panel displays, including touch screens on smart phones and iPads, and is an element of organic light-emitting diodes (OLEDs) and solar cells. The element indium is becoming increasingly rare and expensive. ITO is also brittle, which heightens the risk of a screen cracking when a smart phone is dropped, further ruling ITO out as the basis for flexible displays.

Graphene is an allotrope of carbon in the form of a two-dimensional, atomic-scale, hexagonal lattice in which one atom forms each vertex. Graphene sheets comprising one or more layers of graphene are flexible, about 207 times stronger than steel by weigh, and nearly transparent, and conduct heat and electricity efficiently. The capability of producing high-quality graphene sheets on a large scale has become a key factor in commercializing graphene-based technologies. The stable and excellent mechanical, electrical, and chemical characteristics potentially make graphene sheets with one or a few layers of graphene a cost-effective replacement for ITO as highly conductive, transparent, and flexible electrodes in electronic devices, such as displays and photovoltaic cells. In particular, a highly conductive, transparent, and flexible electrode made from a continuous monolayered graphene thin film can be of high value in electronic devices.

Current techniques for producing graphene devices involve the use of photolithography or e-beam lithography to produce graphene devices having the necessary structures. Some of the disadvantages of these processes include high processing cost, long processing time, low yield, and unwanted doping of graphene. In addition, these processes are not compatible with flexible polymer substrates widely used for touch screens, electronic paper and displays, photovoltaics, lighting, and sensor tags.

It is an object of this disclosure to provide methods of transferring a graphene sheet comprising one or more layers of graphene formed on a metal film, such as a copper film, coating a surface of a metal or alloy substrate onto a target substrate, particularly a flexible target substrate, at the scale and quality required for applications in high performance nanoelectronics and optoelectronics.

BRIEF SUMMARY OF THE INVENTION

According to a first aspect, the present disclosure relates to a method of transferring a graphene sheet comprising one or more layers of graphene onto a target substrate. The method includes fixedly contacting the graphene sheet comprising one or more layers of graphene formed on a copper film coating a surface of a metal or alloy substrate with a contacting surface of the target substrate by applying substantially uniform pressure and heat on a layered assembly. The layered assembly comprises the metal or alloy substrate having the surface coated with the copper film, the graphene sheet formed on the copper film, and the target substrate with the contacting surface in contact with the graphene sheet. At least one layer of graphene of the graphene sheet formed on the copper film coating the surface of the metal or alloy substrate is transferred onto the contacting surface of the target substrate by the substantially uniform pressure and heat, and the at least one layer of graphene forms a graphene film on the contacting surface of the target substrate.

In one or more embodiments, the thickness of the copper film coating the surface of the metal or alloy substrate is about 200-800 nm.

In one or more embodiments, the metal or alloy substrate comprises at least one selected from the group consisting of silicon, Ni, Co, Fe, Pt, Au, Al, Cr, Cu, Mg, Mn, Mo, Rh, Si, Ta, Ti, W, U, V, Zr, brass, bronze, white brass, stainless steel, and Ge.

In one or more embodiments, the metal or alloy substrate has a roll shape, a foil shape, a tube shape, a plate shape, a sheet shape or a wire shape.

In one or more embodiments, the graphene sheet comprising one or more layers of graphene formed on the copper film coating the surface of the metal or alloy substrate is formed by supplying heat and a reaction gas comprising a carbon source to the copper film coating the surface of the metal or alloy substrate for a reaction to grow the one or more layers of graphene of the graphene sheet on the copper film.

In one or more embodiments, the target substrate comprises at least one selected from the group consisting of a polymer, a polymer mixture, a plastic, a rubber, a glass, a metal, Si, and $SiO_2$.

In one or more embodiments, the substantially uniform pressure is at least 5 psi.

In one or more embodiments, the substantially uniform heat applied on the layered assembly heats the layered assembly to a temperature of at least 180° C.

According to a second aspect, the present disclosure relates to a method of transferring a graphene sheet comprising one or more layers of graphene onto a sheet of a flexible target substrate. The method includes fixedly contacting the graphene sheet comprising one or more layers of graphene formed on a copper film coating a surface of a metal or alloy substrate foil with a contacting surface of the sheet of the flexible target substrate by subjecting a layered assembly comprising the metal or alloy substrate foil having the surface coated with the copper film, the graphene sheet formed on the copper film, and the sheet of the flexible target substrate with the contacting surface in contact with the graphene sheet to at least one blank page printing operation in a printing device. The printing device comprises at least one fuser unit comprising at least one heat roller and at least one pressure roller. The at least one fuser unit applies substantially uniform pressure and heat by the at least one pressure roller and the at least one heat roller on the layered assembly during the at least one blank page printing operation, such that at least one layer of graphene of the graphene sheet formed on the copper film coating the surface of the metal or alloy substrate foil is transferred onto the contacting surface of the sheet of the flexible target substrate by the substantially uniform pressure and heat. The at least one layer of graphene forms a graphene film on the contacting surface of the sheet of the flexible target substrate.

In one or more embodiments, the metal or alloy substrate foil comprises at least one selected from the group consisting of silicon, Ni, Co, Fe, Pt, Au, Al, Cr, Cu, Mg, Mn, Mo, Rh, Si, Ta, Ti, W, U, V, Zr, brass, bronze, white brass, stainless steel, and Ge.

In one or more embodiments, the sheet of the flexible target substrate comprises at least one selected from the group consisting of PET (polyethylene terephthalate), polyimide, cellulose acetate, glass, PEN (polyethylene naphthalate), PC (polycarbonate), plastic, and rubber.

In one or more embodiments, one layer of graphene of the graphene sheet formed on the copper film coating the surface of the metal or alloy substrate foil is transferred onto the contacting surface of the sheet of the flexible target substrate by the substantially uniform pressure and heat, and the one layer of graphene forms a monolayered graphene film on the contacting surface of the sheet of the flexible target substrate.

In one or more embodiments, the monolayered graphene film on the contacting surface of the sheet of the flexible target substrate has an optical transmittance of at least 88% when subjected to a light with a wavelength of 300-2000 nm.

In one or more embodiments, the graphene film on the contacting surface of the sheet of the flexible target substrate has a resistance of no greater than 250 $\Omega/cm^2$ by a four probe Van der Pauw method.

In one or more embodiments, the method further comprises stretching the graphene film on the contacting surface of the sheet of the flexible target substrate to form an elongated graphene film. The elongated graphene film has a dimension that is longer, but no greater than about 20% longer than the graphene film before the stretching. The elongated graphene film has a resistance that is the same as, or different from, the resistance of the graphene film before the stretching, but no more than about 10% different from the resistance of the graphene film before the stretching.

In one or more embodiments, the method further comprises stretching the graphene film on the contacting surface of the sheet of the flexible target substrate to form an elongated graphene film, with the elongated graphene film having a dimension that is longer, but no greater than 20% longer than the graphene film before the stretching, and then relaxing the elongated graphene film from the stretching to form a relaxed graphene film. The relaxed graphene film has a resistance that is the same as, or different from, the resistance of the graphene film before the stretching, but no more than about 10% different from the resistance of the graphene film before the stretching.

In one or more embodiments, the method further comprises subjecting the graphene film on the contacting surface of the sheet of the flexible target substrate to a bending strain of no greater than about 30% to form a bent graphene film. The bent graphene film has a resistance that is the same as, or different from, the resistance of the graphene film before being subjected to the bending strain, but no more than about 10% different from the resistance of the graphene film before being subjected to the bending strain.

In one or more embodiments, the method further comprises subjecting the graphene film on the contacting surface of the sheet of the flexible target substrate to a bending strain of no greater than about 30% to form a bent graphene film, and then relaxing the bent graphene film from the bending strain to form a relaxed graphene film. The relaxed graphene film has a resistance that is the same as, or different from, the resistance of the graphene film before being subjected to the bending strain, but no more than about 10% different from the resistance of the graphene film before being subjected to the bending strain.

According to a third aspect, the present disclosure relates to a method of selectively transferring a graphene sheet comprising one or more layers of graphene onto a target substrate. The method includes fixedly contacting the graphene sheet comprising one or more layers of graphene formed on a copper film coating a surface of a metal or alloy substrate with a contacting surface of the target substrate by applying pressure and localized heat with a localized heat source on a layered assembly comprising the metal or alloy substrate having the surface coated with the copper film, the graphene sheet formed on the copper film, and the target substrate with the contacting surface in contact with the graphene sheet. The localized heat source heats at least one localized portion of the layered assembly. At least one layer of graphene of the graphene sheet formed on the copper film coating the surface of the metal or alloy substrate at the at least one localized portion is transferred onto the contacting surface of the target substrate by the pressure and the localized heat. The at least one layer of graphene forms a graphene film at the at least one localized portion of the contacting surface of the target substrate.

In one or more embodiments, the method further comprises moving the localized heat source from the at least one localized portion of the layered assembly to another one or more localized portions of the layered assembly, thereby forming a pattern of localized portions.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
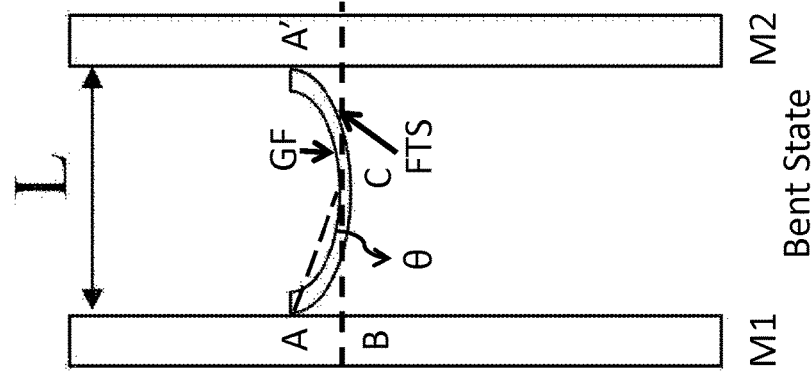
FIG. 1A and FIG. 1B are illustrations of one embodiment of subjecting a graphene film (GF) on the contacting surface of a sheet of a flexible target substrate (FTS) to a bending strain to form a bent graphene film, with FIG. 1A depicting an initial state and FIG. 1B depicting a bent state.

A first aspect of the disclosure relates to a method of transferring a graphene sheet comprising one or more layers of graphene formed on a metal film, such as a copper film, coating a surface of a metal or alloy substrate onto a target substrate. The method includes fixedly contacting the graphene sheet comprising one or more layers of graphene formed on the copper film coating the surface of the metal or alloy substrate with a contacting surface of the target substrate by applying substantially uniform pressure and heat on a layered assembly. The layered assembly comprises the metal or alloy substrate having the surface coated with the copper film, the graphene sheet formed on the copper film, and the target substrate with the contacting surface in contact with the graphene sheet. At least one layer of graphene of the graphene sheet formed on the copper film coating the surface of the metal or alloy substrate is transferred onto the contacting surface of the target substrate by the substantially uniform pressure and heat, and the at least one layer of graphene forms a graphene film on the contacting surface of the target substrate.

The copper film serves as a catalyst layer for the growth and formation of the one or more layers of graphene of the graphene sheet, and may not be limited in shape or thickness. In some embodiments, the copper film takes the shape of the metal or alloy substrate of which surface the copper film is coating, as described below. In some embodiments, the thickness of the copper film coating the surface of the metal or alloy substrate is 100-1000 nm, preferably about 200-800 nm, preferably about 300-600 nm, or more preferably about 400-500 nm.

In other embodiments, the copper film may be substituted by a film of one or more other metals or alloys selected from the group consisting of, but not limited to, Ni, Co, Fe, Pt, Au, Al, Cr, Mg, Mn, Mo, Rh, Si, Ta, Ti, W, U, V, Zr, brass, bronze, white brass, stainless steel, and Ge. The alloy film may or may not contain copper. The copper film or its substitution film may be made of the same material or a different material as compared with the metal or alloy substrate of which surface the copper film or its substitution film is coating. Further, the substitution film, like the copper film, is not limited in shape or thickness, and can be a thin film or a thick film.

In some embodiments, the metal or alloy substrate comprises at least one selected from the group consisting of, but not limited to, silicon, Ni, Co, Fe, Pt, Au, Al, Cr, Cu, Mg, Mn, Mo, Rh, Si, Ta, Ti, W, U, V, Zr, brass, bronze, white brass, stainless steel, and Ge.

In some embodiments, the metal or alloy substrate has, but is not limited to, a roll shape, a foil shape, a tube shape, a plate shape, a sheet shape or a wire shape, and more desirably, in a roll shape, a foil shape, or a sheet shape.

In some embodiments, when the copper film is to be coated on a surface of a metal or alloy substrate, the metal or alloy substrate may be first etched chemically with an etching solution to remove a top layer of the metal or alloy on the surface. Non-limiting examples of the etching solution include a solution containing ammonium persulfate $((NH_4)_2S_2O_8)$, HF, BOE, $Fe(NO_3)_3$, iron(III) chloride $(FeCl_3)$ or $CuCl_2$. The etching solution may be selected depending on the kind of the metal or alloy substrate. For example, if the metal or alloy substrate is made of Ni or Cu, the etching process may be performed by using $FeCl_3$. Further, U.S. Pat. No. 4,917,758, incorporated herein by reference in its entirety, discloses methods of chemically etching copper, particularly copper foil. The etching degree can be adjusted with the concentrations of the etching solutions and/or the etching time. Additionally, the metal or alloy substrate can be etched by a reactive ion etching process, an ion milling process, or an ashing process well known in the art.

In other embodiments, when the copper film is to be coated on a surface of a non-metal substrate, e.g. silicon, the non-metal substrate may be first etched by, for example, sputtering, either with an inert gas (i.e. ion milling or ion etching), or with chemically active ions and radicals (i.e. reactive ion etching), or an ashing process.

In one embodiment, the metal or alloy substrate may be etched only on one surface for the copper film coating. In another embodiment, the metal or alloy substrate may be etched on two or more surfaces for the copper film coating on the two or more surfaces.

The surface(s) of the metal or alloy substrate may then be coated with the copper film by sputter deposition well known in the art. For example, U.S. Pat. No. 6,391,163 B1, incorporated herein by reference in its entirety, discloses a method of forming a copper layer or film on a substrate by using a sputtering process.

In some embodiments, the graphene sheet comprising one or more layers of graphene formed on the copper film coating the surface of the metal or alloy substrate is formed by supplying heat and a reaction gas comprising a carbon source to the copper film coating the surface of the metal or alloy substrate for a reaction to grow the one or more layers of graphene on the copper film. An exemplary embodiment is a chemical vapor deposition method typically used in the art for growing graphene. The chemical vapor deposition method may include, but is not limited to, rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD) or plasma-enhanced chemical vapor deposition (PECVD).

In some embodiments, the process of growing the graphene layer(s) on the copper film can be carried out under an atmospheric pressure, a low pressure, or a vacuum. By way of example, if the process is carried out under an atmospheric pressure, helium (He) may be used as a carrier gas, so that it is possible to minimize damage to graphene caused by collisions against heavy argon (Ar) at high temperatures. Further, if the process is carried out under an atmospheric pressure, it is possible to form a large-area graphene sheet through a simple process with low cost. Meanwhile, if the process is carried out under a low pressure or a vacuum, hydrogen ($H_2$) may be preferably used as an ambient gas to deoxidize an oxidized surface of a metallic catalyst at a high temperature, so that high-quality graphene can be formed.

In some embodiments, the heat treatment in the graphene growth process results in a temperature ranging from about 300° C. to about 2000° C., from about 500° C. to about 1500° C., or from about 800° C. to about 1200° C.

Non-limiting examples of the reaction gas as a carbon source for the graphene growth process include carbon monoxide, carbon dioxide, methane, ethane, ethylene, ethanol, acetylene, propane, butane, butadiene, pentane, pentene, cyclopentadiene, hexane, cylcohexane, benzene, and toluene supplied in the form of gas. The carbon components contained in the carbon source are combined with each other to form a hexagonal plate structure and the graphene sheet comprising one or more layers of graphene can be grown.

In some embodiments, the graphene sheet formed on the copper film by the above-described process may have a large area with a horizontal or longitudinal length of about 1 mm to about 1000 m, about 1 cm-800 m, about 10 cm-600 m, about 50 cm-500 m, about 1 m-400 m, about 10 m-300 m, or about 50 m-200 m. Further, the graphene sheet comprises one or more graphene layers having a homogeneous structure with few or zero defects. Additionally, the thickness of the graphene sheet can be adjusted, for example, to about 0.3-15 nm corresponding to about 1-50 layers of graphene, to about 0.3-12 nm corresponding to about 1-40 layers of graphene, to about 0.3-9 nm corresponding to about 1-30 layers of graphene, to about 0.3-6 nm corresponding to about 1-20 layers of graphene, to about 0.3-3 nm corresponding to about 1-10 layers of graphene, or to about 1-1.5 nm corresponding to about 1-5 layers of graphene.

In some embodiments, the target substrate comprises at least one selected from the group consisting of a polymer, a polymer mixture, a plastic, a rubber, a glass, a metal, Si, and $SiO_2$. Non-limiting examples of the polymer include PET (polyethylene terephthalate), polyimide, cellulose acetate, PEN (polyethylene naphthalate), and PC (polycarbonate). In some embodiments, the target substrate is preferably flexible for easy transfer of the graphene sheet, for example, when the metal or alloy substrate is in a roll shape and rollers are used for the graphene sheet transfer described below. An exemplary flexible target substrate may comprise at least one selected from PET (polyethylene terephthalate), polyimide, glass, PEN (polyethylene naphthalate), PC (polycarbonate), cellulose acetate, plastic, and rubber. The above flexible materials containing the transferred graphene sheet then may be used for electronic devices, for example, as electrodes.

In some embodiments, the target substrate has the same or similar shape as the copper film-coated metal or alloy substrate as described above for easy transferring of the graphene sheet with the maximal contact between the graphene sheet and the contacting surface of the target substrate. For example, when the copper film-coated metal or alloy substrate has a roll shape or a sheet shape, the target substrate preferably also has a matching roll shape or sheet shape so that the target substrate can be conveniently matched and assembled with the copper film-coated metal or alloy substrate to form the layered assembly ready for the graphene sheet transfer with the disclosed method. For another example, when the copper film coated-metal or alloy substrate has a foil shape, the target substrate may have a foil shape, a sheet shape, or a plate shape compatible with the foil shape of the copper film coated-metal or alloy substrate for easy and maximal transferring of the graphene sheet. In other embodiments, the target substrate may have a different shape from the copper film-coated metal or alloy substrate, for example, when a specific patterning of graphene on the contacting surface of the target substrate is an objective of the transferring whereas the maximal coverage of graphene on the contacting surface of the target substrate is not. For instance, the copper film coated-metal or alloy substrate may have a wire shape and the target substrate may have a sheet shape, a foil shape, or a plate shape. Depending on the way the wire-shaped copper film coated-metal or alloy substrate is assembled with the target substrate to form the layered assembly, the graphene layer(s) transferred onto the contacting surface of the target substrate may form a specific pattern intended for a particular purpose or utility. Of course, once the graphene layer(s) are transferred onto the contacting surface of the target substrate, the target substrate, particularly the flexible target substrate, can be bent, curved, cornered (to form an angle at corners), folded, or molded to any shapes or forms manually or by machinery well known in the art.

In the method, the fixedly contacting the graphene sheet comprising one or more layers of graphene formed on the copper film coating the surface of the metal or alloy substrate with a contacting surface of the target substrate is achieved by applying substantially uniform pressure and heat on a layered assembly comprising the metal or alloy substrate having the surface coated with the copper film, the graphene sheet formed on the copper film, and the target substrate with the contacting surface in contact with the graphene sheet. In some embodiments, the fixedly contacting may be further facilitated or strengthened by using a variety of techniques known in the art that suitably stabilize the layered assembly and preserve the integrity of the graphene sheet and the target substrate, for example and without limitation, sewing, taping, adhering via an adhesive, stapling, or clamping with a spring clamp.

The target substrates, particularly commercially available polymer substrates, may exhibit different mechanical properties and temperature responses. Thus, the pressure and temperature need to be determined accordingly, and this determination is within the capability of those having ordinary skill in the art. In some embodiments, the substantially uniform pressure is at least 2 psi, preferably at least 5 psi, preferably at least 8 psi, or preferably at least 10 psi. In some embodiments, the substantially uniform heat heats the layered assembly to a temperature of at least 150° C., preferably at least 180° C., preferably at least 200° C., preferably at least 250° C., or preferably at least 300° C.

In a preferred embodiment, the pressure and heat applied on the layered assembly is evenly, or uniformly, distributed across a horizontal plane that defines the contacting surface of the target substrate, i.e. any portion of the contacting surface of the target substrate in contact with the graphene sheet is subjected to the same amount of pressure and same amount of heat (to reach the same temperature). However, a slight variation in pressure and heat that different portions of the contacting surface of the target substrate are subjected to may or may not (significantly or detectably) affect the evenness or sameness of the graphene layers transferred onto the different portions of the contacting surface of the target substrate, with respect to, without limitation, the number of layers or thickness of the graphene layers, the quality or the amount of defects of the graphene layers, and the optical, electrical, and mechanical properties of the graphene layers. In some embodiments, the variation in pressure across the horizontal plane that defines the contacting surface of the target substrate is no more than 10%, no more than 8%, preferably no more than 5%, more preferably no more than 3%, or more preferably no more than 1%, of the amount of the pressure to make the pressure applied on the layered assembly "substantially uniform". In some embodiments, the variation in heat across the horizontal plane that defines the contacting surface of the target substrate is no more than 10%, no more than 8%, preferably no more than 5%, more preferably no more than 3%, or more preferably no more than 1%, of the amount of the heat to make the heat applied on the layered assembly "substantially uniform."

In some embodiments, the substantially uniform pressure is applied to the layered assembly by passing the layered assembly through one or more pairs of rollers, with the distance between the two rollers in each roller pair properly adjusted based on the pressure desired and the thickness of the layered assembly. In other embodiments, when the copper film is coated on one or more than one surface of the metal or alloy substrate, for example, when the copper film is coated on one surface or both surfaces of a metal or alloy foil, sheet, or plate, and the graphene sheet is formed on the copper film on the one surface or both surfaces of the metal or alloy foil, sheet, or plate, a stack of the layered assemblies with each graphene sheet contacting a different contacting surface of the target substrate(s) may be formed and passed through the one or more pairs of rollers. Multiple pairs of rollers are preferred when the layered assembly is long to prevent the layered assembly from being bent or drooping downwards, and/or multiple passing of the layered assembly through the rollers is required to get a desired number of graphene layers transferred onto the contacting surface of the target substrate.

In some embodiments, the substantially uniform heat treatment is applied by exposing the layered assembly, or a stack thereof, to heat from at least one heat source, e.g. a heated oven, a heating lamp, a radiator, a gas or electric heater, etc., while the layered assembly is passed through the one or more roller pairs. By controlling the number of times the layered assembly is passed through the one or more roller pairs under the substantially uniform heat treatment, and/or by controlling the intensity of the substantially uniform heat treatment in conjunction with or not the intensity of the substantially uniform pressure from the one or more roller pairs, a monolayer, a bilayer, or multiple layers, e.g. 3-50 layers, 3-40 layers, 3-30 layers, 3-20 layers, 3-10 layers, or 3-5 layers, of graphene may be transferred from the copper film coating the surface of the metal or alloy substrate onto the contacting surface of the target substrate.

In other embodiments, the substantially uniform pressure is applied to the layered assembly, or a stack thereof, by laying one side (that is parallel with the component layers in the assembly, i.e. the layer of the metal or alloy substrate, the layer of the copper film coating the surface of the metal or alloy substrate, the layer of the graphene sheet formed on the copper film, the layer of the target substrate with the contacting surface in contact with the graphene sheet) of the layered assembly, or a stack thereof, on a fixed support and pressing the opposite side of the layered assembly, or a stack thereof, with a roller press apparatus comprising rollers, or by placing a weight on the opposite side. In some embodiments, the rollers of the roller press apparatus or the weight also function as a heat source supplying to the layered assembly, or a stack thereof, the substantially uniform heat while supplying the substantially uniform pressure. In other embodiments, the heat source supplying the substantially uniform heat to the layered assembly, or a stack thereof, is separate from the rollers of the roller press apparatus or the weight, and may be, for example, a temperature-controlled heated oven, heating lamp, radiator, gas or electric heater, etc. The specific number of the graphene layers of the graphene film formed on the contacting surface of the target substrate may be controlled by the intensity and/or duration of the substantially uniform pressure and heat treatment, and/or the number of times the layered assembly is subjected to the substantially uniform pressure and heat treatment of fixed intensity and duration.

The number of the graphene layers of the graphene film formed on the contacting surface of the target substrate may be determined or estimated by, without limitation, the Raman spectra, images of the graphene film obtained from atomic force microscopy and transmission electron microscopy, or the weight of the graphene film based on the area of the graphene film, the thickness of a single layer of graphene being 0.345 nm, and the density of a typical graphene film being about 1.5-2.0 g/cm$^3$.

A second aspect of the disclosure relates to a method of transferring a graphene sheet comprising one or more layers of graphene onto a sheet of a flexible target substrate. The method includes fixedly contacting the graphene sheet comprising one or more layers of graphene formed on a copper film coating a surface of a metal or alloy substrate foil with a contacting surface of the sheet of the flexible target substrate by subjecting a layered assembly comprising the metal or alloy substrate foil having the surface coated with the copper film, the graphene sheet formed on the copper film, and the sheet of the flexible target substrate with the contacting surface in contact with the graphene sheet to at least one blank page printing operation in a printing device. The printing device comprises at least one fuser unit comprising at least one heat roller and at least one pressure roller. The at least one fuser unit applies substantially uniform pressure and heat by the at least one pressure roller and the at least one heat roller on the layered assembly during the at least one blank page printing operation, such that at least one layer of graphene of the graphene sheet formed on the copper film coating the surface of the metal or alloy substrate foil is transferred onto the contacting surface of the sheet of the flexible target substrate by the substantially uniform pressure and heat. The at least one layer of graphene forms a graphene film on the contacting surface of the sheet of the flexible target substrate.

In some embodiments, the formation of the graphene sheet on the copper film, the coating of the surface of the metal or alloy substrate foil with the copper film, and the layered assembly have the same characteristics as the formation of the graphene sheet on the copper film, the coating of the surface of the metal or alloy substrate with the copper film, and the layered assembly described in the first aspect of the disclosure.

In some embodiments, the metal or alloy substrate foil comprises at least one selected from the group consisting of silicon, Ni, Co, Fe, Pt, Au, Al, Cr, Cu, Mg, Mn, Mo, Rh, Si, Ta, Ti, W, U, V, Zr, brass, bronze, white brass, stainless steel, and Ge.

The thickness of metal or alloy substrate foil is preferably 10-1500 µm, or more preferably 50-1200 µm, or more preferably 80-1000 µm, or more preferably 100-800 µm, or more preferably 150-600 µm, or more preferably 200-500 µm.

In some embodiments, the sheet of the flexible target substrate comprises at least one selected from the group consisting of PET (polyethylene terephthalate), polyimide, cellulose acetate, glass, PEN (polyethylene naphthalate), PC (polycarbonate), plastic, and rubber.

The thickness of the sheet of the flexible target substrate is preferably 10-500 µm, preferably 25-450 µm, preferably 50-400 µm, preferably 75-350 µm, preferably 100-300 µm, or preferably 150-200 µm.

Non-limiting examples of the printing device include a laser printer, a copier, and the like that transfer or fuse ink, toner particles, and the like materials onto a print medium, e.g. paper, a transparent polymer sheet, plastic, fabric, cloth, etc, with pressure and heat provided by a fuser unit or a similar unit comprising at least one pressure roller and at least one heat roller.

In some embodiments, the fuser unit or a similar unit may comprise at least two heat rollers supplying both the substantially uniform pressure and the substantially uniform heat.

In some embodiments, the ink, toner particles, or the like materials may not be present in the printing device, since the layered assembly is subjected to at least one blank page printing operation of the printing device.

In other embodiments, the printing device may not be capable of transferring or fusing ink, toner particles, or the like onto a print medium due to certain defects or modifications, as long as the fuser unit or a similar unit of the printing device is operative to apply substantially uniform pressure and heat on the layered assembly, since the layered assembly is subjected to at least one blank page printing operation of the printing device.

In some embodiments, a monolayer, a bilayer, or multiple layers, e.g. 3, 4, 5, and up to 50 layers, of graphene of the graphene sheet are transferred from the copper film coating the surface of the metal or alloy substrate foil onto the contacting surface of the sheet of the flexible target substrate by the substantially uniform pressure and heat, forming a monolayered, a bilayered, or a multi-layered (e.g. 3, 4, 5, and up to 50 layers) graphene film on the contacting surface of the sheet of the flexible target substrate.

In some embodiments, the monolayered, the bilayered, or the multi-layered graphene film on the contacting surface of the sheet of the flexible target substrate covers at least 60%, at least 70%, at least 80%, at least 90%, or at least 95%, of the contacting surface of the sheet of the flexible target substrate.

In some embodiments, the monolayered graphene film on the contacting surface of the sheet of the flexible target substrate has an optical transmittance of at least 70%, preferably at least 80%, more preferably at least 88%, or more preferably at least 95%, when subjected to a light with a wavelength of 300-2000 nm, 500-1800 nm, 700-1500 nm, 900-1300 nm, or 1000-1200 nm. In some embodiments, the monolayered, bilayered, or multi-layered graphene film on the contacting surface of the sheet of the flexible target substrate has a resistance of no greater than 20 $\Omega/cm^2$, no greater than 40 $\Omega/cm^2$, no greater than 70 $\Omega/cm^2$, no greater than 100 $\Omega/cm^2$, no greater than 120 $\Omega/cm^2$, no greater than 150 $\Omega/cm^2$, no greater than 180 $\Omega/cm^2$, no greater than 200 $\Omega/cm^2$, no greater than 250 $\Omega/cm^2$, no greater than 300 $\Omega/cm^2$, no greater than 400 $\Omega/cm^2$, or no greater than 500 $\Omega/cm^2$, by a four probe Van der Pauw method.

In one embodiment, the method further comprises stretching the graphene film on the contacting surface of the sheet of the flexible target substrate, either in one direction, e.g. horizontal, longitudinal, or any direction between horizontal and longitudinal such as diagonal, or in multiple directions, e.g. a biaxial stretching that may be a combination of a horizontal and a longitudinal stretching performed either sequentially or simultaneously, a multi-axial stretching that involves stretching in more than two directions that may be parallel to the horizontal plane of the graphene film and/or the contacting surface of the sheet of the flexible target substrate, such as a combination of a horizontal stretching, a longitudinal stretching, and a diagonal stretching, or in one or more directions, with at least one direction that is not parallel to, but intersects with, the horizontal plane of the graphene film and/or the contacting surface of the sheet of the flexible target substrate at an angle of more than 0°, e.g. a direction perpendicular to the horizontal plane of the graphene film and/or the contacting surface of the sheet of the flexible target substrate, to form an elongated graphene film. The elongated graphene film has a dimension, parallel or not to the horizontal plane of the graphene film and/or the contacting surface of the sheet of the flexible target substrate, that is longer, but no greater than about 5%, no greater than about 10%, no greater than about 15%, no greater than about 20%, no greater than about 30%, or no greater than about 40% longer than the graphene film before the stretching. In some embodiments, the elongated graphene film may have the same resistance as the graphene film before the stretching. In other embodiments, the elongated graphene film may have a resistance that is different from the resistance of the graphene film before the stretching, but no more than about 0.5%, no more than about 1%, no more than about 2%, no more than about 5%, no more than about 8%, no more than about 10%, no more than about 15%, or no more than about 20% different from the resistance of the graphene film before the stretching. In some embodiments, the graphene film on the contacting surface of the sheet of the flexible target substrate may be stretched only once. In other embodiments, the graphene film on the contacting surface of the sheet of the flexible target substrate may be stretched repeatedly, i.e. the stretched graphene film may be subsequently relaxed from the stretching and be stretched again, and the number of times of the repeated stretching may be at least 5, 10, 50, 100, 200, 300, 400, or 500 times.

In another embodiment, the method further comprises stretching the graphene film on the contacting surface of the sheet of the flexible target substrate in one direction or in multiple directions as described above, to form an elongated graphene film. The elongated graphene film has a dimension, parallel or not to the horizontal plane of the graphene film and/or the contacting surface of the sheet of the flexible target substrate, that is longer, but no greater than about 5%, no greater than about 10%, no greater than about 15%, no greater than about 20%, no greater than about 30%, or no greater than about 40% longer than the graphene film before the stretching. And then the elongated graphene film is relaxed from the stretching to form a relaxed graphene film. In some embodiments, the relaxed graphene film may have the same resistance as the graphene film before the stretching. In other embodiments, the relaxed graphene film may have a resistance that is different from the resistance of the graphene film before the stretching, but no more than about 0.5%, no more than about 1%, no more than about 2%, no more than about 5%, no more than about 8%, no more than about 10%, no more than about 15%, or no more than about 20% different from the resistance of the graphene film before the stretching. In some embodiments, the graphene film on the contacting surface of the sheet of the flexible target substrate may be stretched and relaxed only once. In other embodiments, the graphene film on the contacting surface of the sheet of the flexible target substrate may be stretched and relaxed repeatedly, i.e. the relaxed graphene film may be subsequently stretched and relaxed again, and the number of times of the repeated stretching and relaxing may be at least 5, 10, 50, 100, 200, 300, 400, or 500 times.

In one embodiment, the method further comprises subjecting the graphene film on the contacting surface of the sheet of the flexible target substrate to a bending strain to form a bent graphene film. This can be accomplished by, for example, using a bending device disclosed in Chinese Patent Application No. CN 104183698 A, incorporated herein by reference in its entirety, and illustrated in FIGS. 1A and 1B. In the illustrated example shown in FIG. 1A, the graphene film (GF) on the contacting surface of the sheet of the flexible target substrate (FTS) has a flat surface facing upwards, with the two ends of the film A and A' fixed on two vertical members of the bending device M1 and M2, and with the linear distance between the two ends of the graphene film A and A' being $L_0$ at the initial state. Referring to FIG. 1B, then the graphene film is bent inwardly by moving the two vertical members of the bending device M1 and M2 towards each other, such that in a bent state, the graphene film has a curved surface, with the linear distance between the two ends (A and A') of the graphene film L being less than $L_0$. Of course, by having the flat surface of the graphene film (GF) facing downwards at the initial state, performing the same bending procedure described above will result in bending the graphene film outwardly. In the bent state illustrated in FIG. 1B, an imaginary baseline defined by line BC that is parallel to the horizontal plane of the graphene film at the initial state and intersects with the bent graphene film at a single point C and line AC form a bending angle $\theta$. Thus, the degree of bending of the graphene film can be quantified by the percentage of bending defined by $(L_0-L)\times 100\%/L_0$ or the bending angle $\theta$.

Figure 2:
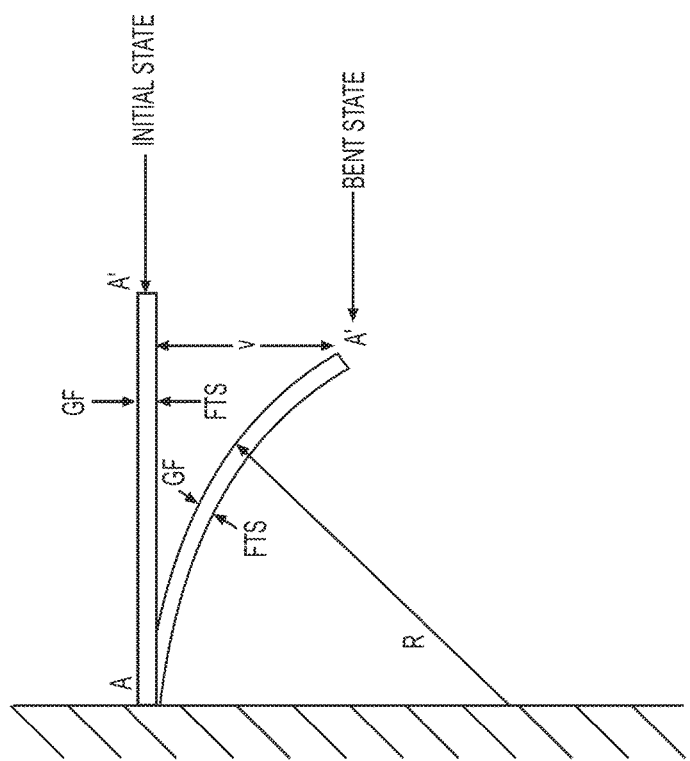
FIG. 2 is an illustration of another embodiment of subjecting a graphene film (GF) on the contacting surface of a sheet of a flexible target substrate (FTS) to a bending strain to form a bent graphene film.

The graphene film on the contacting surface of the sheet of the flexible target substrate may be subjected to a bending strain to form a bent graphene film by still another method illustrated in FIG. 2. Referring to FIG. 2, the graphene film (GF) having two ends A and A' and disposed horizontally on the contacting surface of the sheet of the flexible target substrate (FTS) has a flat surface facing upwards at the initial state. The end A of the graphene film is fixed while the other end A' is movable. By moving the A' end of the graphene film clockwise towards the fixed end A, the graphene film is bent outwardly as shown. Moving the A' end of the graphene film counter-clockwise will result in bending the graphene film inwardly. Alternatively, by having the flat surface of the graphene film (GF) facing downwards at the initial state and moving the A' end of the graphene film clockwise will also result in bending the graphene film inwardly. In the bent state shown in FIG. 2, the surface of the graphene film is no longer flat but curved, with the radius of curvature being R and the deflection of the movable end A' being V, which is the vertical distance between A' at the bent state and the horizontal plane of the graphene film at the initial state. In this method, the degree of bending of the graphene film can be quantified by the ratio of the deflection V to the radius of curvature R expressed as a percentage, i.e. V/R×100%.

In some embodiments, the graphene film on the contacting surface of the sheet of the flexible target substrate is subjected to a bending strain, either inward or outward, and measured by the percentage of bending defined by $(L_0-L)\times 100\%/L_0$ or by the ratio of deflection V to radius of curvature R expressed as a percentage (i.e. V/R×100%) that is no greater than about 5%, no greater than about 10%, no greater than about 20%, no greater than about 30%, no greater than about 40%, or no greater than about 50%. In other embodiments, the graphene film on the contacting surface of the sheet of the flexible target substrate is subjected to a bending strain, either inward or outward, and measured by the bending angle $\theta$ that is no greater than about 10°, no greater than about 20°, no greater than about 40°, no greater than about 60°, no greater than about 75°, or no greater than about 90°. In some embodiments, the resulting bent graphene film may have the same resistance as the graphene film before being subjected to the bending strain. In other embodiments, the resulting bent graphene film may have a resistance that is different from the resistance of the graphene film before being subjected to the bending strain, but no more than about 1%, no more than about 2%, no more than about 5%, no more than about 8%, no more than about 10%, no more than about 15%, or no more than about 20% different from the resistance of the graphene film before being subjected to the bending strain. In some embodiments, the graphene film on the contacting surface of the sheet of the flexible target substrate may be subjected to the bending strain only once. In other embodiments, the graphene film on the contacting surface of the sheet of the flexible target substrate may be subjected to the bending strain repeatedly, i.e. the bent graphene film may be subsequently relaxed from the bending strain and be subjected to the bending strain again, and the number of times of the repeated bending may be at least 5, 10, 50, 100, 200, 300, 400, or 500 times.

Figure 1B:
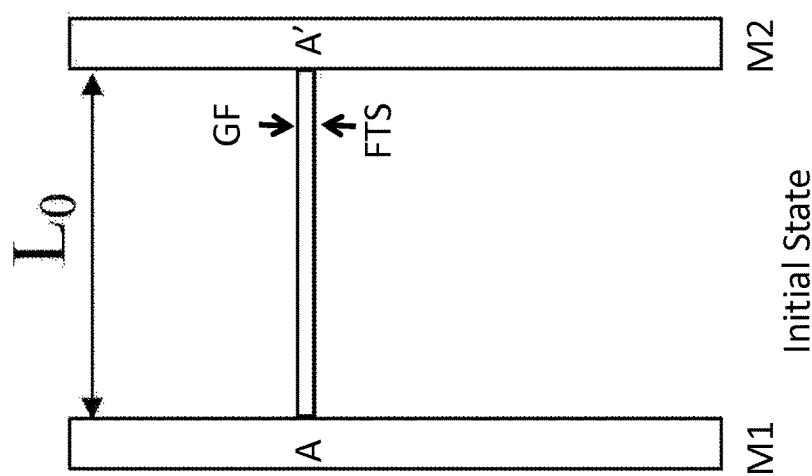

Besides the bending methods illustrated in FIGS. 1A and 1B and FIG. 2, there are other ways of bending the graphene film on the contacting surface of the sheet of the flexible target substrate, for example, bending the graphene film by hand, and/or bending the graphene film along a line, similar to folding, such that the resulting graphene film forms one or more angular surfaces.

In some embodiments, the method further comprises subjecting the graphene film on the contacting surface of the sheet of the flexible target substrate to a bending strain, either inward or outward, with the percentage of bending defined by $(L_0-L)\times 100\%/L_0$ or the ratio of deflection V to radius of curvature R expressed as a percentage (i.e. V/R×100%) being no greater than about 5%, no greater than about 10%, no greater than about 20%, no greater than about 30%, no greater than about 40%, or no greater than about 50%, or alternatively, to a bending strain with the bending angle $\theta$ being no greater than about 10°, no greater than about 20°, no greater than about 40°, no greater than about 60°, no greater than about 75°, or no greater than about 90°, to form a bent graphene film, and then relaxing the bent graphene film from the bending strain to form a relaxed graphene film. In some embodiments, the relaxed graphene film may have the same resistance as the graphene film before being subjected to the bending strain. In other embodiments, the relaxed graphene film may have a resistance that is different from the resistance of the graphene film before being subjected to the bending strain, but no more than about 0.5%, no more than about 1%, no more than about 2%, no more than about 5%, no more than about 8%, no more than about 10%, no more than about 15%, or no more than about 20% different from the resistance of the graphene film before being subjected to the bending strain. In some embodiments, the graphene film on the contacting surface of the sheet of the flexible target substrate may be subjected to the bending strain followed by the relaxation from the bending strain only once. In other embodiments, the graphene film on the contacting surface of the sheet of the flexible target substrate may be subjected to the bending strain and the subsequent relaxation from the bending strain repeatedly, i.e. the relaxed graphene film may be subsequently subjected to another round of bending and relaxation from the bending, and the number of times of the repeated bending and relaxation may be at least 5, 10, 50, 100, 200, 300, 400, or 500 times.

A third aspect of the disclosure relates to a method of selectively transferring a graphene sheet comprising one or more layers of graphene onto a target substrate. The method includes fixedly contacting the graphene sheet comprising one or more layers of graphene formed on a copper film coating a surface of a metal or alloy substrate with a contacting surface of the target substrate by applying pressure and localized heat with a localized heat source on a layered assembly comprising the metal or alloy substrate having the surface coated with the copper film, the graphene sheet formed on the copper film, and the target substrate with the contacting surface in contact with the graphene sheet. The localized heat source heats at least one localized portion of the layered assembly. At least one layer of graphene of the graphene sheet formed on the copper film coating the surface of the metal or alloy substrate at the at least one localized portion is transferred onto the contacting surface of the target substrate by the pressure and the localized heat. The at least one layer of graphene forms a graphene film at the at least one localized portion of the contacting surface of the target substrate.

In some embodiments, the formation of the graphene sheet on the copper film, the coating of the surface of the metal or alloy substrate with the copper film, the metal or alloy substrate, the target substrate, and the layered assembly have the same characteristics as those described in the first aspect of the disclosure.

In some embodiments, the pressure being applied to the layered assembly may be a substantially uniform pressure, and can be applied in the same fashion as described in the first aspect. In other embodiments, the pressure being applied to the layered assembly may be a localized pressure co-localizing with the localized heat. For example, the localized pressure may come from a weight applied to a localized portion of the layered assembly and maintained at a pre-determined temperature to also apply localized heat to the same localized portion of the layered assembly.

In the method of this aspect, one or more layers of graphene of the portion of the graphene sheet exposed to the localized heat, together under either localized pressure on the same portion or substantially uniform pressure on the same and other portions of the graphene sheet, are selectively transferred onto the contacting surface of the target substrate, forming a graphene film at the localized portion of the contacting surface of the target substrate treated by the localized heat.

In some embodiments, the method further comprises moving the localized heat source from the at least one localized portion of the layered assembly to another one or more localized portions of the layered assembly, thereby forming a pattern of localized portions.

In one embodiment, the localized heat source is a laser beam, optionally coupled with a deflection mirror. The position and orientation of the laser beam and/or the deflection mirror can be changed and controlled by, for example, a computer to select and change the localized portions to selectively transfer one or more graphene layers of the graphene sheet onto the contacting surface of the target substrate and/or to form a pattern of the graphene film on the contacting surface of the target substrate through the selective transferring. The specific number of the graphene layers of the graphene film formed on the contacting surface of the target substrate may be controlled by the intensity and/or duration of the pressure and localized heat treatment, and/or the number of times the layered assembly is subjected to the pressure and localized heat treatment of fixed intensity and duration.

In other embodiments, the localized heat source may be one or more localized heat conductive bodies, e.g. metal blocks, connected to a heat generating source, e.g. a hot plate, or one or more localized heat generating bodies, e.g. electrical resistance heating elements, that provide heat to the selected portions of the layered assembly.

The area percentage of the graphene sheet in contact with the contacting surface of the target substrate that is selectively transferred onto the contacting surface of the target substrate can vary between 0% and 100%, depending on the area of the localized portion(s) of the graphene sheet exposed to the localized heat and/or the pattern of the graphene film desired and formed on the contacting surface. For example, when the localized heat source is a single laser beam, the area of the localized portion of the graphene sheet exposed to the localized heat from the single laser beam may be very small, so that only a small area percentage of the graphene sheet is transferred onto the contacting surface of the target substrate. However, when the localized heat source is an array of laser beams, or a moving laser beam, or a fixed laser beam with a position/orientation-changeable deflection mirror, the area of the localized portions of the graphene sheet exposed to the localized heat may be quite large, so that a large area percentage of the graphene sheet is transferred onto the contacting surface of the target substrate.

Having generally described this invention, a further understanding can be obtained by reference to certain specific examples which are provided herein for purposes of illustration only and are not intended to be limiting unless otherwise specified.

Example 1

Preparation of a Copper Film Coating a Copper Foil and Growth of a Large Graphene Sheet on the Copper Film by Chemical Vapor Deposition A 1-mm thick copper foil of 30×40 cm in size was first etched chemically to remove a top layer by treating the copper foil with a 1 M ferric chloride solution at 50° C. for 10 minutes. A 400-nm thick copper film was deposited on the etched surface of the copper foil by sputter deposition technique with a DC magnetron sputter Emitech K575XD machine. The sputtering target was a copper target of 12 cm in diameter, with a thickness of 2 cm and a purity of 99.9999%. The etched copper foil substrate was mounted at 10 cm from the copper target. The chamber of the sputtering machine was filled with a high purity argon gas (purity: 99.999%). The deposition process was carried out at a pressure of $2.1\times10^{-7}$ torr for 15 min and at a fixed current of 70 mA. The copper foil coated with the 400-nm thick copper film was introduced into a quartz tube of a homemade reactor for atmospheric pressure thermal chemical vapor deposition. Argon and hydrogen gases were allowed to flow through the quartz tube at a rate of 275 sccm and 35 sccm, respectively, for 15 minutes. During this time, the temperature was adjusted to reach 1000° C. The gases were left to flow for an additional 90 minutes at this temperature. After the 90 minutes, the hydrogen valve was closed and the methane gas was allowed to flow at a rate of 5 sccm for 3 minutes. Then the quartz tube with the copper foil inside was removed quickly from the thermal reactor to cool down at room temperature in the presence of hydrogen and argon gas flows.

Example 2

Transfer of the Large Graphene Sheet Comprising One or More Layers of Graphene Formed on the Copper Film Coating the Copper Foil onto a Transparent Polymer Sheet A transparent polymer sheet was first covered by a piece of white paper in such a way that an about 1 mm margin from each side of the polymer sheet was left uncovered. Then an adhesive spray was applied to each margin, followed by the removal of the white paper. The copper foil coated with the copper film, on which the large graphene sheet had been formed, was put on the transparent polymer sheet, with the graphene sheet contacting a surface of the transparent polymer sheet, and fixedly bound to the transparent polymer sheet along the adhesive margins of the transparent polymer sheet, forming a layered assembly with the graphene sheet on the copper film sandwiched between the copper foil and the transparent polymer sheet.

The layered assembly was placed in the paper tray of a laser printer controlled by a computer. After an order was given to the computer to print a blank page, the layered assembly underwent a printing process inside the laser printer, including passing through the fuser unit comprising a heat roller and a pressure roller. The layered assembly underwent such a blank page printing process repeatedly for a number of times. It was found that the number of the repeated printing processes the layered assembly was subjected to determined the number of the graphene layers of the graphene sheet transferred from the copper film coating the surface of the copper foil onto the contacting surface of the transparent polymer sheet. When the layered assembly was subjected to the laser printing process 3 times, one layer of graphene of the graphene sheet was transferred, forming a monolayered graphene film on the contacting surface of the transparent polymer sheet. When the layered assembly was subjected to the laser printing process 22 times, multiple layers of graphene of the graphene sheet were transferred, forming a multi-layered graphene film on the contacting surface of the transparent polymer sheet. After a desired number of graphene layers were transferred, the transparent polymer sheet was peeled off from the copper foil.

Example 3

Figure 3:
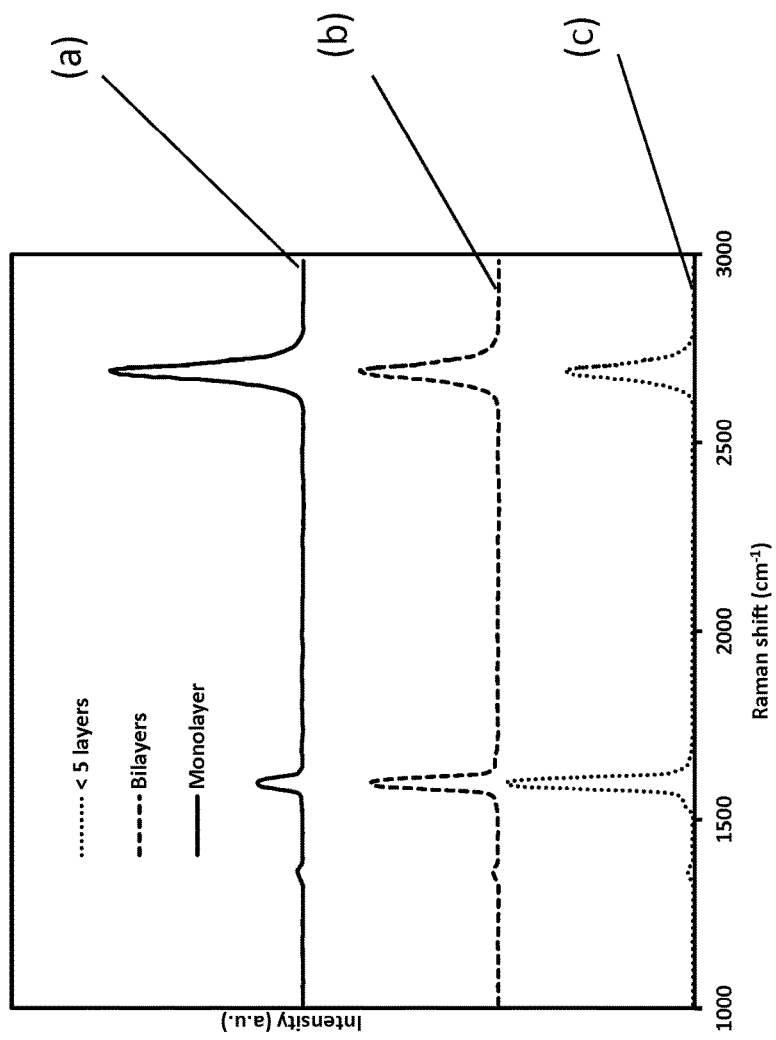
FIG. 3 is a graphical presentation of the Raman spectrum of a monolayered, a bilayered, and a multi-layered graphene film formed on a transparent polymer sheet following the transferring of a graphene sheet onto the transparent polymer sheet according to Example 3.

Characterization of the Graphene Film Formed on the Contacting Surface of the Transparent Polymer Sheet by the Transferring FIG. 3 is a graphical presentation of the Raman spectrum of a monolayered graphene film formed on the transparent polymer sheet after repeatedly subjecting the layered assembly to the laser printing process 3 times represented by line (a); the Raman spectrum of a bilayered graphene film formed on the transparent polymer sheet after repeatedly subjecting the layered assembly to the laser printing process 10 times represented by line (b); and the Raman spectrum of a multi-layered (greater than 2 layers but fewer than 5 layers) graphene film formed on the transparent polymer sheet after repeatedly subjecting the layered assembly to the laser printing process 22 times represented by line (c).

Referring to FIG. 3, the peak at 1347-49 $cm^{-1}$ corresponds to the D-band indicating a primary disorder of the graphite crystalline structure. The peak at 1570-73 $cm^{-1}$ corresponds to the G-band which arises from the sp2 carbon-carbon stretch vibration. The peak at 2670-90 $cm^{-1}$ corresponds to the 2D band related to the graphitic lattice vibration modes. The D-band peak intensity was very low, indicating that the graphene films formed by the transferring were of high quality with very few defects.

Referring to FIG. 3, line (a), the peak intensity ratio of the 2D-band to the G-band was greater than 2, i.e. 3.6, indicating that the graphene film is a monolayered graphene film resulting from the transfer of one layer of graphene onto the transparent polymer sheet.

Referring to FIG. 3, line (b), the peak intensity ratio of the 2D-band to the G-band was 2.1, indicating that the graphene film is a bilayered graphene film resulting from the transfer of two layers of graphene onto the transparent polymer sheet.

Referring to FIG. 3, line (c), the peak intensity ratio of the 2D-band to the G-band was less than 1, indicating that the graphene film is a multi-layered graphene film resulting from the transfer of greater than 2 but fewer than 5 layers of graphene onto the transparent polymer sheet.

Figure 4:
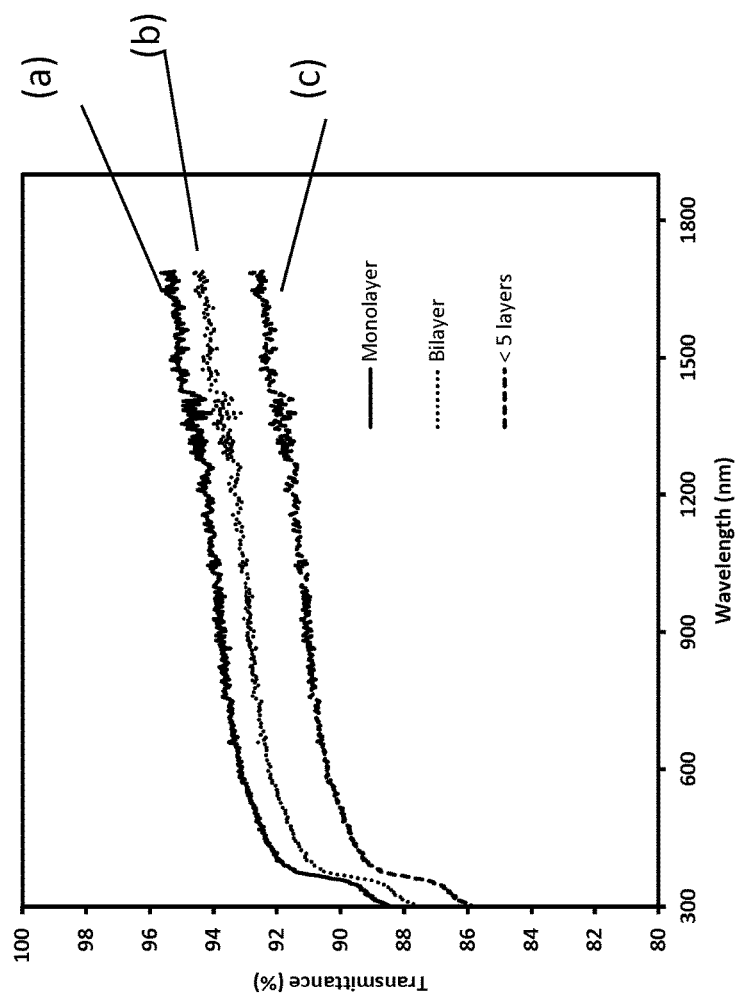
FIG. 4 is a graphical presentation of the optical transmittance of a monolayered, a bilayered, and a multi-layered graphene film formed on a transparent polymer sheet following the transferring of a graphene sheet onto the transparent polymer sheet and subjection of each of the graphene films to a light with a wavelength of from 300 nm to 2000 nm according to Example 3.

FIG. 4 is a graphical presentation of the optical transmittance of a monolayered graphene film formed on the transparent polymer sheet represented by line (a), a bilayered graphene film formed on the transparent polymer sheet represented by line (b), and a multi-layered (greater than 2 layers but fewer than 5 layers) graphene film formed on the transparent polymer sheet represented by line (c), following the transfer of the graphene layer(s) onto the transparent polymer sheet and subjection of each of the graphene films to a light with a wavelength of from 300 nm to 2000 nm. The optical transmittance was measured by a UV-vis-NIR (Near Infra-Red) spectrophotometer. The optical transmittance of the monolayered, bilayered, or multi-layered graphene film was increased with the increasing wavelength of the light, with the monolayered graphene film displaying an optical transmittance ranging from about 89-96%, the bilayered graphene film from about 88-94%, and the multi-layered graphene film (with 3 or more but fewer than 5 layers of graphene) from about 86-92%.

Figure 5:
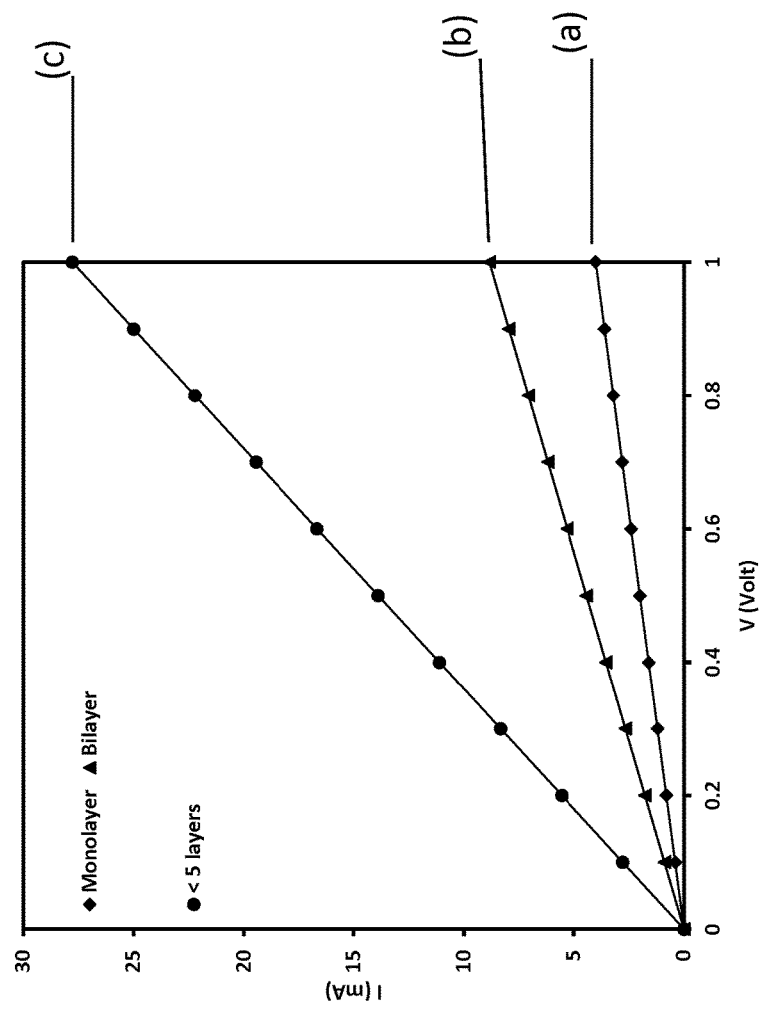
FIG. 5 is a graphical presentation of the I (current)-V (voltage) relationship graphs of a monolayered, a bilayered, and a multi-layered graphene film formed on a transparent polymer sheet following the transferring of a graphene sheet onto the transparent polymer sheet according to Example 3.

The monolayered, bilayered, or multi-layered graphene film on the transparent polymer sheet may function as a transparent electrode. Their electrical properties were measured by using the four probe Van der Pauw method with a 1 $cm^2$ area of the graphene film. FIG. 5 is a graphical presentation of the I (current)-V (voltage) relationship graphs of the monolayered graphene film formed on the transparent polymer sheet represented by line (a), the bilayered graphene film formed on the transparent polymer sheet represented by line (b), and the multi-layered (greater than 2 layers but fewer than 5 layers) graphene film formed on the transparent polymer sheet represented by line (c). The graphene transparent electrodes obtained with the monolayered, bilayered, and multi-layered graphene films on the transparent polymer sheet showed Ohmic behavior, with a resistance of 250, 113, and 36 $\Omega/cm^2$ for the monolayered, bilayered, and multi-layered graphene films on the transparent polymer sheet, respectively.

Figure 6:
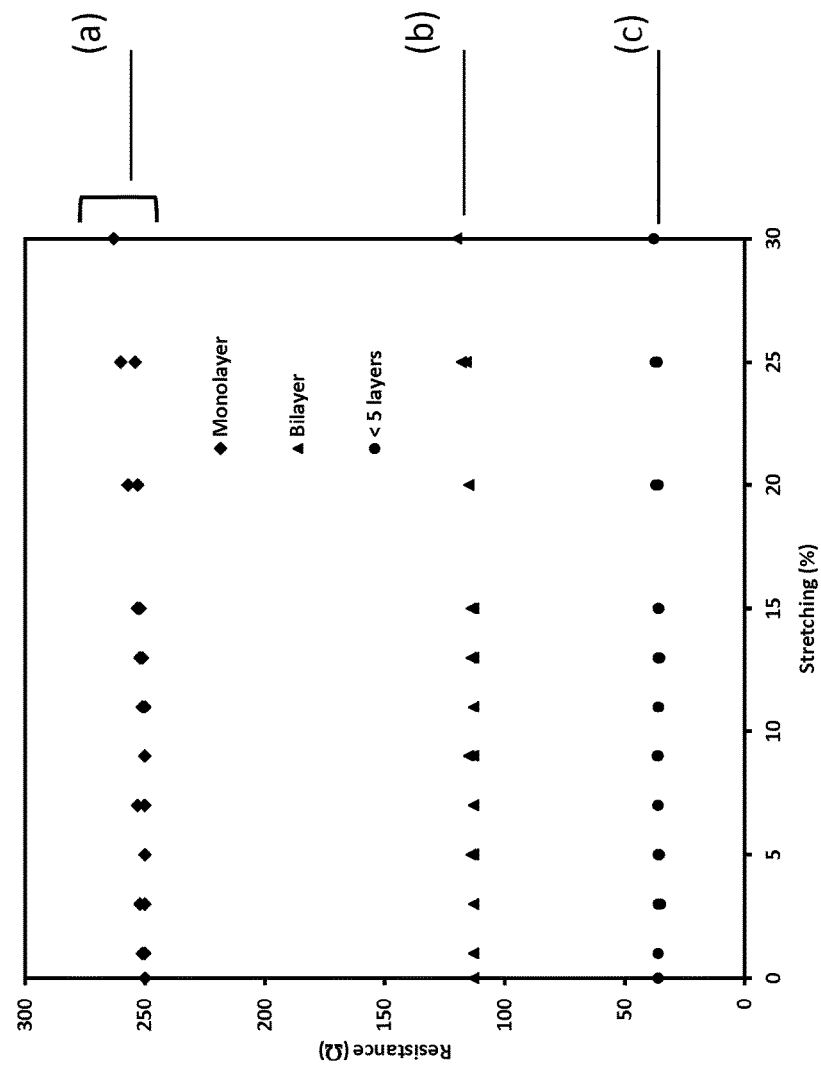
FIG. 6 is a graphical presentation of the resistance-mechanical stretching relationship graphs of a monolayered, a bilayered, and a multi-layered graphene film formed on a transparent polymer sheet following the transferring of a graphene sheet onto the transparent polymer sheet according to Example 3.

The mechanical properties of the monolayered, bilayered, and multi-layered graphene films on the transparent polymer sheet were evaluated by measuring the resistance of the graphene films against the tensile strain (stretching) applied to the graphene films longitudinally using an Instron 5542 mechanical tester. FIG. 6 is a graphical presentation of the resistance-mechanical stretching relationship graphs of the monolayered graphene film formed on the transparent polymer sheet represented by group (a) data points, the bilayered graphene film formed on the transparent polymer sheet represented by group (b) data points, and the multi-layered (greater than 2 layers but fewer than 5 layers) graphene film formed on the transparent polymer sheet represented by group (c) data points. There was a minor change in the resistance of the monolayered, bilayered, or multi-layered graphene film when each graphene film was stretched from 0% to 20% of its original dimension, i.e. the change was 1.3±0.2% of the resistance of the graphene film before the stretching, and the resistance of each graphene film was restored to almost its original value after the graphene film was relaxed from the stretched state, i.e. the resistance of the graphene film relaxed from the stretched state was 99.5±0.3% of the resistance of the graphene film before the stretching.

Figure 7:
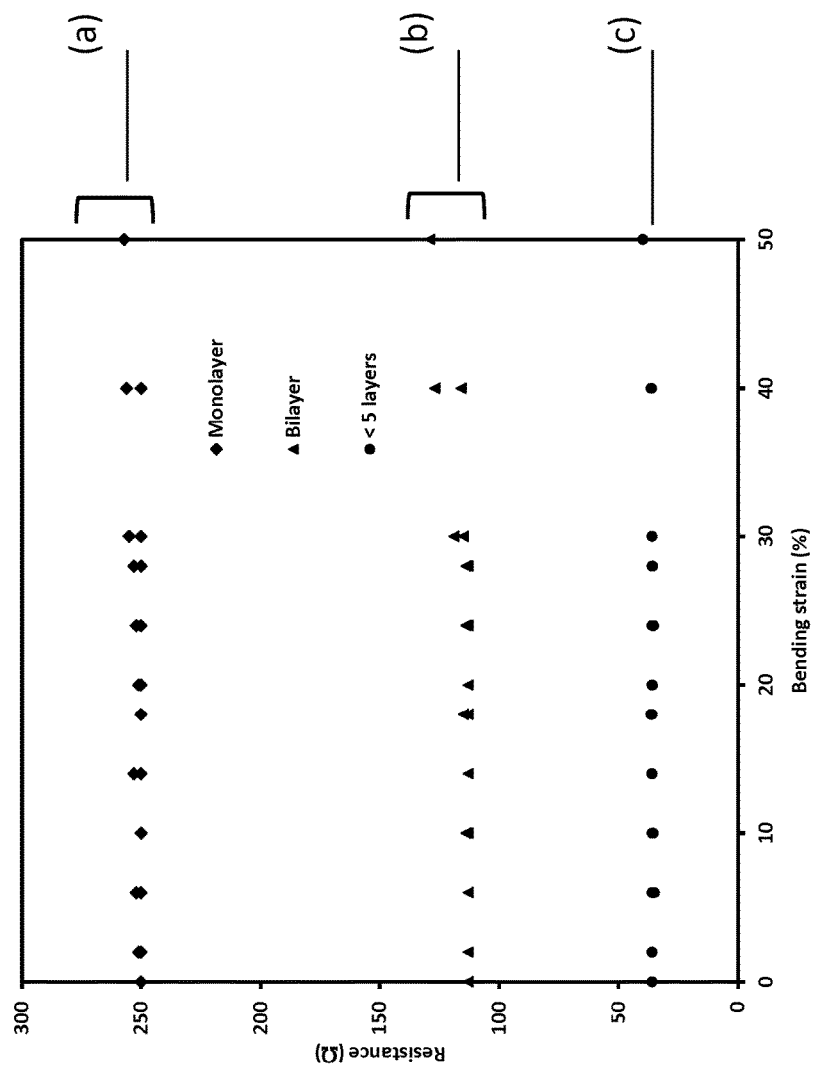
FIG. 7 is a graphical presentation of the resistance-mechanical bending strain relationship graphs of a mono-layered, a bilayered, and a multi-layered graphene film formed on a transparent polymer sheet following the transferring of a graphene sheet onto the transparent polymer sheet according to Example 3.
Figure 8:
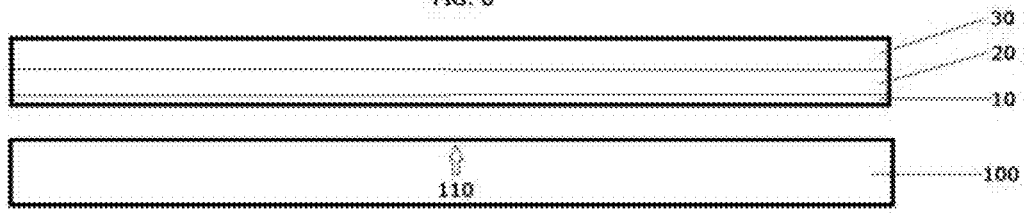
FIG. 8 is a graphical illustration of two substrates of the invention. The first substrate comprises at least one graphene layer (10), a copper film (20), and a foil (30). The second target substrate (100) comprises a contacting surface (110) where the at least one graphene layer (10) of the first substrate contacts the second substrate (100).

The resistance of the monolayered, bilayered, and multi-layered graphene films on the transparent polymer sheet against the bending strain applied to the graphene films was measured. FIG. 7 is a graphical presentation of the resistance-mechanical bending strain relationship graphs of the monolayered graphene film formed on the transparent polymer sheet represented by group (a) data points, the bilayered graphene film formed on the transparent polymer sheet represented by group (b) data points, and the multi-layered (greater than 2 layers but fewer than 5 layers) graphene film formed on the transparent polymer sheet represented by group (c) data points, with the bending strain quantified by the ratio of deflection V to radius of curvature R expressed as a percentage (i.e. V/R×100%) described above. There was a minor change in the resistance of the monolayered, bilayered, or multi-layered graphene film when each graphene film was subjected to an outward bending strain of 0-30%, i.e. the change was 1.1±0.2% of the resistance of the graphene film before being bent. The resistance of each graphene film was restored to almost its original value after each graphene film was relaxed from the bending strain, i.e. the resistance of the graphene film relaxed from the bending strain was 99.8±0.1% of the resistance of the graphene film before being bent. Thus, the graphene films formed on the transparent polymer sheet by the disclosed graphene transfer method exhibited excellent mechanical stability.

The invention claimed is:

1. A method for transferring a graphene layer on a first substrate onto a second target substrate, comprising:
   contacting a graphene layer on the first substrate, which comprises one or more layers of graphene formed on a copper film that is formed on a surface of a metal foil, with a contacting surface of the second target substrate under substantially uniform pressure and heat, thereby transferring the at least one graphene layer from the first substrate onto the contacting surface of the second target substrate;
   wherein the thickness of the copper film that is formed on the surface of the metal foil of the first substrate is about 200-800 nm; and
   wherein the transferring consists essentially of applying substantially uniform pressure and heat.

2. The method of claim 1, wherein the thickness of the copper film that is formed on the surface of the metal foil of the first substrate is about 400-500 nm.

3. The method of claim 1, wherein the metal foil of the first substrate is an alloy comprising Cu and at least one metal selected from the group consisting of silicon, Ni, Co, Fe, Pt, Au, Al, Cr, Ge, Mg, Mn, Mo, Rh, Si, Ta, Ti, W, U, V, and Zr.

4. The method of claim 1, wherein the metal foil is a copper foil.

5. The method of claim 1, further comprising growing the one or more graphene layers on the metal foil by contacting the foil with a reaction gas comprising carbon and with heat, thereby growing the one or more graphene layers on the foil.

6. The method of claim 1, wherein the second target substrate comprises at least one selected from the group consisting of a polymer, a polymer mixture, a plastic, a rubber, a glass, a metal, Si, and $SiO_2$.

7. The method of claim 1, wherein the substantially uniform pressure is at least 5 psi.

8. The method of claim 1, wherein the contacting of the graphene layer on the first substrate to the contacting surface of the second target substrate occurs at a temperature of at least 180° C.

9. A method of transferring a graphene layer on a first substrate onto a flexible second target substrate, comprising:
   contacting a graphene layer on the first substrate, which comprises one or more layers of graphene formed on a copper film that is formed on a surface of a metal foil, with a contacting surface of the flexible second target substrate under substantially uniform pressure and heat, thereby transferring the at least one graphene layer from the first substrate onto the contacting surface of the flexible second target substrate, and
   subjecting the flexible second target substrate to which the at least one graphene layer has been transferred to at least one blank page printing operation conducted by a printing device which comprises at least one fuser unit that comprises at least one heat roller and at least one pressure roller; wherein during the at least one blank page printing operation the at least one fuser unit applies substantially uniform pressure and heat on the flexible second target substrate to which the at least one graphene layer has been transferred via the at least one pressure roller and via the at least one heat roller;
   wherein the thickness of the copper film coating the surface of the metal foil of the first substrate is about 200-800 nm; and
   wherein the transferring consists essentially of applying substantially uniform pressure and heat.

10. The method of claim 9, wherein the metal foil is etched to remove its surface prior to formation of the copper film on it.

11. The method of claim 9, wherein the flexible second target substrate comprises at least one selected from the group consisting of polyethylene terephthalate, polyimide, cellulose acetate, glass, polyethylene naphthalate, polycarbonate, plastic, and rubber.

12. The method of claim 9, wherein only one layer of graphene on the first substrate is transferred to the contacting surface of the flexible second substrate where it forms a monolayered graphene film.

13. The method of claim 12, wherein the monolayered graphene film on the contacting surface of the flexible second target substrate has an optical transmittance of at least 88% when subjected to a light with a wavelength of 300-2000 nm.

14. The method of claim 9, wherein the graphene film on the contacting surface of the flexible second target substrate has a resistance of no greater than 250 $\Omega/cm^2$ by a four probe Van der Pauw method.

15. The method of claim 9, further comprising stretching the graphene film on the contacting surface of the flexible second target substrate to form an elongated graphene film,
   wherein the elongated graphene film has a dimension that is longer, but no greater than about 20% longer than the graphene film before the stretching, and
   wherein the elongated graphene film has a resistance that is the same as, or different from, the resistance of the graphene film before the stretching, but no more than about 10% different from the resistance of the graphene film before the stretching.

16. The method of claim 9, further comprising stretching the graphene film on the contacting surface of the flexible second target substrate to form an elongated graphene film,
   wherein the elongated graphene film has a dimension that is longer, but no greater than 20% longer than the graphene film before the stretching, and then
   relaxing the elongated graphene film from the stretching to form a relaxed graphene film,
   wherein the relaxed graphene film has a resistance that is the same as, or different from, the resistance of the graphene film before the stretching, but no more than about 10% different from the resistance of the graphene film before the stretching.

17. The method of claim 9, further comprising subjecting the graphene film on the contacting surface of the flexible second target substrate to a bending strain of no greater than about 30% to form a bent graphene film,
   wherein the bent graphene film has a resistance that is the same as, or different from, the resistance of the graphene film before being subjected to the bending strain, but no more than about 10% different from the resistance of the graphene film before being subjected to the bending strain.

18. The method of claim 9, further comprising subjecting the graphene film on the contacting surface of the flexible second target substrate to a bending strain of no greater than about 30% to form a bent graphene film, and then
   relaxing the bent graphene film from the bending strain to form a relaxed graphene film,
   wherein the relaxed graphene film has a resistance that is the same as, or different from, the resistance of the graphene film before being subjected to the bending strain, but no more than about 10% different from the resistance of the graphene film before being subjected to the bending strain.

19. The method of claim 1, wherein the transferring consists essentially of applying substantially uniform pressure of at least 2 psi and heat of at least 150° C. and substantially uniform pressure and temperature vary by no more than 10% over the contacting surface of the second target substrate.

20. The method of claim 1, wherein the transferring consists essentially of applying substantially uniform pressure of at least 10 psi and heat of at least 300° C. and substantially uniform pressure and temperature vary by no more than 1% over the contacting surface of the second target substrate.

* * * * *